(12) United States Patent
Sakuma et al.

(10) Patent No.: US 11,784,160 B2
(45) Date of Patent: Oct. 10, 2023

(54) ASYMMETRIC DIE BONDING

(71) Applicant: International Business Machines Corporation, Armonk, NY (US)

(72) Inventors: Katsuyuki Sakuma, Fishkill, NY (US); Krishna R. Tunga, Wappingers Falls, NY (US); Shidong Li, Hopewell Junction, NY (US); Griselda Bonilla, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 17/030,360

(22) Filed: Sep. 23, 2020

(65) Prior Publication Data
US 2022/0093556 A1    Mar. 24, 2022

(51) Int. Cl.
*H01L 23/00* (2006.01)
*H01L 21/48* (2006.01)

(52) U.S. Cl.
CPC .......... *H01L 24/81* (2013.01); *H01L 21/4853* (2013.01); *H01L 24/13* (2013.01); *H01L 24/14* (2013.01); *H01L 24/16* (2013.01); *H01L 2224/13023* (2013.01); *H01L 2224/14132* (2013.01); *H01L 2224/16238* (2013.01); *H01L 2224/81193* (2013.01); *H01L 2224/81194* (2013.01); *H01L 2224/81203* (2013.01)

(58) Field of Classification Search
None
See application file for complete search history.

(56) References Cited

U.S. PATENT DOCUMENTS

| | | | |
|---|---|---|---|
| 5,962,924 A * | 10/1999 | Wyland | H01L 24/81 257/737 |
| 9,412,899 B2 | 8/2016 | Herner | |
| 9,761,561 B2 | 9/2017 | Rajoo | |
| 2012/0319269 A1 | 12/2012 | Pang | |

(Continued)

FOREIGN PATENT DOCUMENTS

| | | |
|---|---|---|
| CN | 102403308 A | 4/2012 |
| JP | 06181303 A | 6/1994 |
| TW | 1574365 B | 3/2017 |

OTHER PUBLICATIONS

An et al., "Die-Attach Structure of Silicon-on-Glass MEMS Devices Considering Asymmetric Packaging Stress and Thermal Stress," Sensors, vol. 19, Issue 18, Sep. 14, 2019, 13 pages. <https://www.mdpi.com/1424-8220/19/18/3979>.

(Continued)

*Primary Examiner* — Hung K Vu
(74) *Attorney, Agent, or Firm* — Grant M. McNeilly (57) ABSTRACT

An integrated circuit package substrate (ICPS) system includes a die including a first array of connectors and a substrate including a second array of connectors that is configured to be thermocompression bonded to the first array of connectors at a bonding temperature that is above a solder melting temperature. The first die is bonded to the substrate such that the first die is asymmetric with respect to a substrate center, and the second array of connectors is adjusted, at an alignment temperature that is below the solder melting temperature, for thermal expansion to the bonding temperature with respect to a reference point that is not a first die center.

20 Claims, 5 Drawing Sheets

(56) References Cited

U.S. PATENT DOCUMENTS

2013/0270693 A1 10/2013 Tseng
2018/0182733 A1 6/2018 Chylak

OTHER PUBLICATIONS

Gagnon et al., "Thermo-compression bonding and mass reflow assembly processes of 3D logic die stacks," 2017 IEEE 67th Electronic Components and Technology Conference (ECTC), May 2017, pp. 116-122. <https://www.ibm.com/downloads/cas/EA6KXKLQ>.

Zhang et al., "Materials, processing and reliability of low temperature bonding in 3D chip stacking," Journal of Alloys and Compounds 750, Mar. 2018, pp. 980-995. <https://doi.org/10.1016/j.jallcom.2018.04.040>.

International Search Report and Written Opinion dated Nov. 29, 2021, for International Application No. PCT/EP2021/074585, filed Sep. 7, 2021, IBM.

\* cited by examiner

ASYMMETRIC DIE BONDING

BACKGROUND

The present disclosure relates to integrated circuit package substrates (ICPSs), and more specifically, to a thermally compensated array of connectors in a thermocompression bonded ICPS system.

Traditional ICPSs can be employed in computing systems to perform computing functions. These functions can be executed using various semiconductor dies (a.k.a., computer chips) such as processors and memory. One or more of these dies can be mechanically and electrically bonded to a laminate substrate, and the substrate can include other connections to other components on the substrate as well as input/output connections for the computing system. More specifically, a die can have an array of electrical conductors that extend toward the substrate, and the substrate can have an array of electrical conductors that extend toward the die. Solder can then mechanically and electrically connect each die conductor with its corresponding substrate conductor. Thereby, the die can be integrated into the overall computing system.

SUMMARY

According to some embodiments of the present disclosure, an integrated circuit package substrate (ICPS) system includes a die including a first array of connectors and a substrate including a second array of connectors that is configured to be thermocompression bonded to the first array of connectors at a bonding temperature that is above a solder melting temperature. The first die is bonded to the substrate such that the first die is asymmetric with respect to a substrate center, and the second array of connectors is adjusted, at an alignment temperature that is below the solder melting temperature, for thermal expansion to the bonding temperature with respect to a reference point that is not a first die center.

According to some embodiments of the present disclosure, a method of making an ICPS system includes locating each connector in a first array of connectors on a die at a bonding temperature that is above a solder melting temperature, and adjusting locations for each connector in a second array of connectors on a substrate at the alignment temperature with respect to a reference point that is not a die center such that the second array of connectors is aligned with a first array of connectors when the first array of connectors and the second array of connectors are at the bonding temperature. The method further includes aligning the die and the substrate at an alignment temperature that is below the solder melting temperature such that the die is asymmetric with respect to a substrate center, heating the first array of connectors to the bonding temperature, heating the second array of connectors to the bonding temperature; and thermocompression bonding the die to the substrate.

According to some embodiments of the present disclosure, an ICPS system includes a substrate having a first coefficient of thermal expansion, the substrate comprising a first array of connectors, and a first die having a second coefficient of thermal expansion that is different than the first coefficient of thermal expansion, the first die comprising a second array of connectors. The first die is thermocompression bonded to the substrate by connecting the first array of connectors and the second array of connectors, the first die is positioned asymmetrically with respect to a substrate center, and the first array of connectors is thermally adjusted asymmetrically with respect to a first die center.

DETAILED DESCRIPTION

Figure 1:
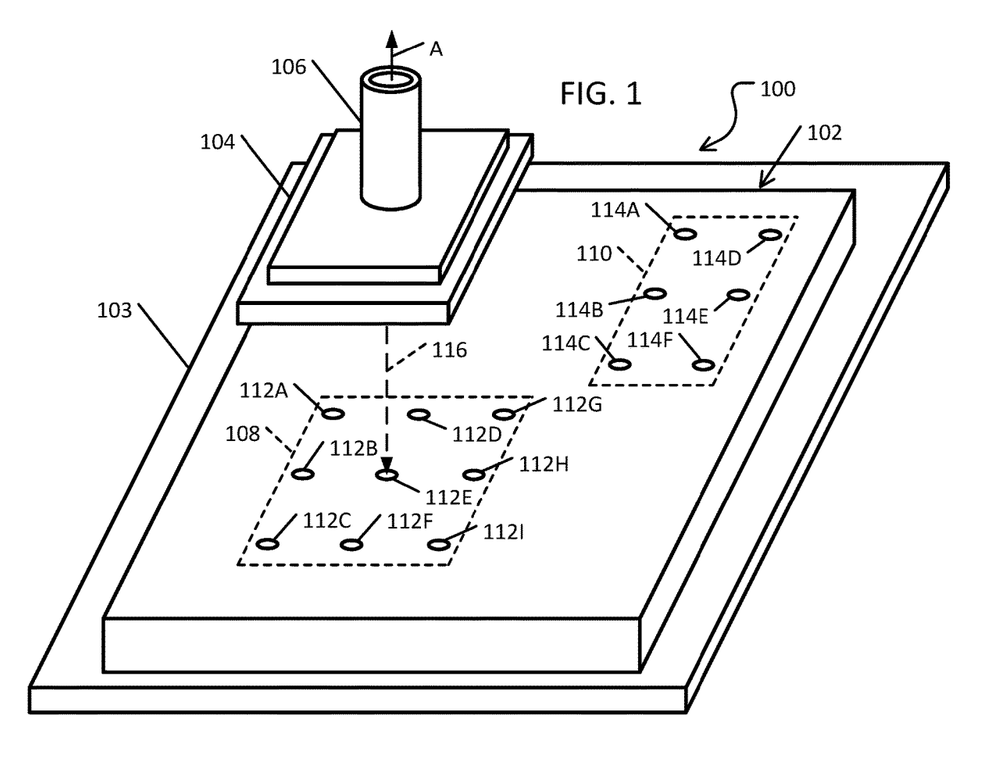
FIG. 1 is a perspective view of an ICPS system being assembled, according to embodiments of the present disclosure.

FIG. 1 is a perspective view of integrated circuit package substrate (ICPS) system 100 being assembled. ICPS system 100 comprises laminate substrate 102, die 104, and bonding head 106. Substrate 102 includes site 108 and site 110 for bonding substrate 102 to dies, such as die 104. More specifically, site 108 includes bumps 112A-112I (collectively, "bumps 112") and site 110 includes bumps 114A-114F (collectively, "bumps 114"). Bumps 112, 114 are electrical connectors configured to interface with electrical connectors on dies using solder joints (shown in FIGS. 2A and 2B). In other embodiments, substrate 102 can include greater or fewer sites and/or bumps.

While bumps 112, 114 are depicted as being relatively large and sparse with respect to substrate 102 and die 104 in FIG. 1, in some embodiments, bumps 112, 114 can be relatively small and tightly packed. For example, site 108 and die 104 can be up to 800 mm$^2$, whereas each of bumps 112, 114 can be at least 5 μm and up to 50 μm wide (along sites 108, 110), at least 10 μm and up to 50 μm tall (extending from sites 108, 110), and pitched up to 100 μm (i.e., spaced apart from each other by not more than 100 μm, which is considered to be fine pitched). In some embodiments, bumps 112, 114 can have a pitch of 40 μm. Furthermore, sites 108, 110 can have different pitches (including larger pitches than 100 μm) and/or there can be portions of sites 108, 110 that have different pitches than other portions of that same site 108, 110.

In the illustrated embodiment, substrate 102 is temporarily attached to bonding stage 103 for example, by drawing a vacuum against the bottom side of substrate 102. Bonding stage 103 can also be heated (e.g., to 80° C.) to heat substrate 102, for example, to maintain a constant elevated bonding temperature that is below the melting temperature of the solder throughout the bonding process. In addition, die 104 is temporarily attached to bonding head 106, for example, by drawing a vacuum against the top side of die 104 (indicated by the arrow A by a pump (not shown). Bonding head 106 is depicted as being smaller than die 104 but can be larger in some embodiments. Bonding head 106 is used to move die 104 toward substrate 102 (as indicated by arrow 116) to align die 104 properly with respect to site 108. Bonding head 106 move the electrical contacts of die 104 in contact with the electrical contacts of substrate 102. Bonding head 106 can also hold die 104 accurately in place with force against substrate 102 while bonding head 106 is heated (e.g., to 350° C.) to heat die 104 to its bonding temperature. Thereby, the solder is heated above its melting temperature (e.g., 240° C.) during the bonding portion of the thermocompression bonding process.

Thereby, die 104 can be bonded to substrate 102 at site 108 even if site 108 has fine pitch bumps 112. In addition, other dies (not shown) can also be bonded to substrate 102, for example, at site 110. This allows for heterogeneous integration of multiple dies on a single substrate 102, which can aid in high performance computing and artificial intelligence hardware.

Figure 2A:
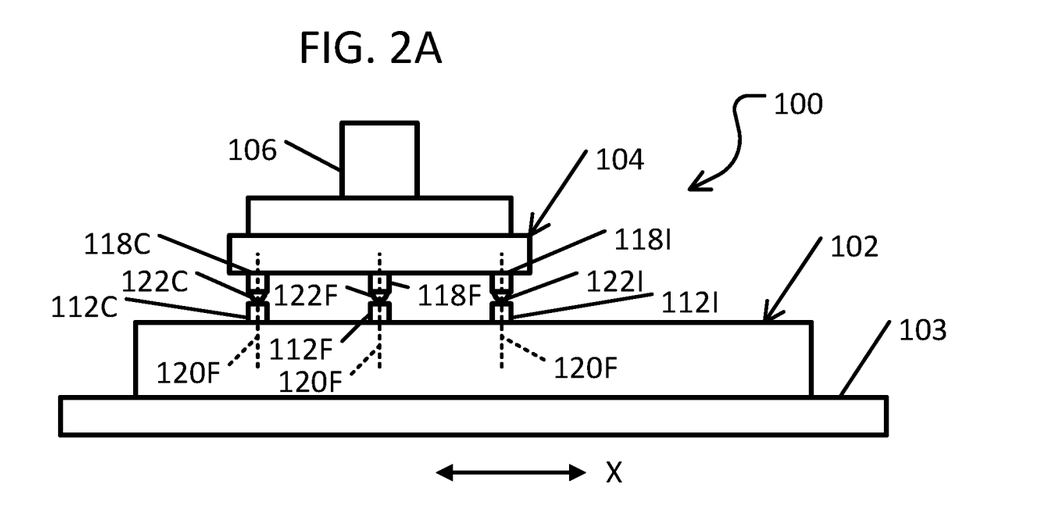
FIGS. 2A and 2B are side elevation views of the ICSP system being assembled, according to embodiments of the present disclosure.
Figure 2B:
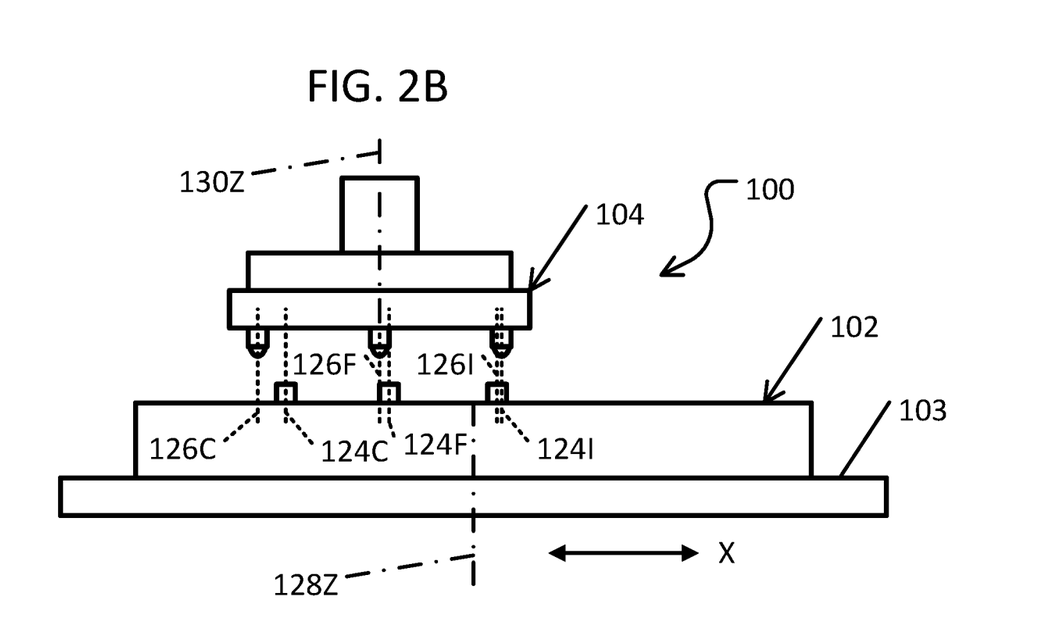

FIGS. 2A and 2B are side elevation views of ICPS system 100 being assembled. More specifically, FIG. 2A is a view of substrate 102 and die 104 at their respective bonding temperatures, which can be above the solder melting temperature. In some embodiments, the bonding temperatures of substrate 102 and die 104 are the same, and in other embodiments, they are different. For example, the bonding temperature of bonding stage 103 can be 100° C., and the bonding temperature of bonding head 106 can be 350° C., which can be result in solder bumps 122 being heated to at least 240° C. In other embodiments, other bonding temperatures can be used, for example, provided that the bonding temperature of solder bumps 122 is higher than the melting point of their material, for example, 227° C. for Sn—Cu solder, 221° C. for Sn—Ag solder, 217° C. for Sn—Ag—Cu solder, or 138° C. for Sn—Bi solder.

In the illustrated embodiment, bonding head 106 is holding die 104 in alignment with substrate 102. This is evidenced by bumps 112C, 112F, and 112I on substrate 102 being aligned with posts (or pillars) 118C, 118F, and 118I on die 104, which is indicated by coincident centerlines 120C, 120F, 120I. While only pairs of corresponding bumps/posts 112C/118C, 112F/118F, and 112I/118I are shown in FIG. 2A, the other pairs of corresponding bumps/posts 112/118 (since die 104 can include nine posts 118A-118I (collectively, "posts 118")) would also be aligned when substrate 102 and die 104 are at their corresponding bonding temperatures.

Also shown in FIG. 2A are solder bumps 122C, 122F, and 122I, although each of posts 118 can include one of solder bumps 122A-122I (collectively, "solder bumps 122), respectively. While solder bumps 122 can be initially formed on bumps 118, solder bumps 122 could be initially attached to bumps 112. In the illustrated embodiment, solder bumps 122 can be 3 μm tall or larger, for example, 7 μm. Bumps 112, posts 118, and solder bumps 122 are comprised of electrically conducting materials, such as metals such as copper. For example, bumps 112 can be comprised of copper, nickel, palladium, or gold, and posts 118 can be comprised of copper or nickel, and solder bumps 122 can be comprised of relatively low melting point metals such as tin, copper, silver, indium, or bismuth (as discussed above). Thereby, when bonding head 106 holds posts 118 against bumps 112, solder bumps 122 can flow to electrically and mechanically connect each pair of bumps/posts 112/118 (although this configuration is not shown in FIG. 2A or 2B).

In contrast, FIG. 2B is a view of substrate 102 and die 104 properly aligned at their alignment temperatures, which are typically at elevated temperatures, such as 100° C. and 150° C., respectively. In the illustrated embodiment, substrate 102 can be mostly comprised of an electrically-insulative, glass-reinforced polymer material, and die 104 can be mostly comprised of a semiconductor material, such as silicon. Therefore, substrate 102 and die 104 can have different coefficients of thermal expansion (CTEs). For example, the CTE of substrate 102 can be at least 2 parts-per-million per degree Celsius (ppm/° C.) different than the CTE of die 104.

In some embodiments, the CTE of substrate 102 is greater than the CTE of die 104, which is depicted in FIG. 2B by substrate 102 having contracted more from its bonding temperature than die 104 has contracted from its bonding temperature despite substrate 102 having a lower bonding temperature than die 104.

To ensure that die 104 is bonded to substrate 102 properly, die 104 is aligned with substrate 102 at the alignment temperature. This can occur, for example, by inserting a camera (not shown) between substrate 102 and die 104 and verifying that visual marks (not shown) on substrate 102 and die 104 are aligned. Because of the differences in thermal expansion between die 104 and substrate 102 at their respective bonding temperatures, posts 118 will not be aligned with its corresponding bumps 112 when die 104 is properly aligned with substrate 102 at the alignment temperature. This is evidenced by centerlines 124C, 124F, and 124I (collectively, "centerlines 124") of bumps 112 being offset from centerlines 126C, 126F, and 126I (collectively, "centerlines 126"), respectively, of posts 118. Therefore, when designing substrate 102, the position of each bump 112 can be compensated (i.e., moved across the face of substrate 102) to account for the differing amount of thermal expansion between substrate 102 and die 104.

In the illustrated embodiment, die 104 is positioned asymmetrically with respect to the center of substrate 102. This is shown by substrate centerline 128Z being spaced apart from die centerline 130Z. This can occur because, for example, there are other dies that are also bonded to substrate 102 such that die centerline 130Z cannot be positioned coincident with substrate centerline 128Z. During thermal expansion, objects can expand with respect to their thermal center. In a symmetrically shaped object, this can be the center of that object. This means that, generally, substrate 102 will expand laterally (in the X-direction) from substrate centerline 128Z, whereas die 104 will expand laterally (in the X-direction) from die centerline 130Z. Therefore, when designing substrate 102, the position of each bump 112 can be offset (i.e., moved across the face of substrate 102) from the previously compensated position to account for the difference in locations of substrate centerline 128Z and die centerline 130Z. More specifically, the position of each bump 112 can be offset with respect to substrate centerline 128Z. Such offsetting is evident in FIG. 2B by the difference in distance between centerline 124C and centerline 126C being greater than the difference in distance between centerline 124I and centerline 126I, as well as centerline 124F and centerline 126F not being coincident. Thereby, the offsetting of bumps 112 can be asymmetric with respect to die centerline 130Z, and the resulting array of bumps 112 can be asymmetric with respect to die centerline 130Z at the alignment temperature. Furthermore, the array of posts 118 can be asymmetric and unaligned with the array of bumps 112 when die 104 is properly aligned with substrate 102 at the alignment temperature.

In contrast, if bumps 112 were merely compensated for the thermal expansion of substrate 102 and die 104, bumps 112 would be positioned with respect to die centerline 130Z. In such a scenario, the difference in distance between centerline 124C and centerline 126C would be the same as the difference in distance between centerline 124I and centerline 126I, and centerline 124F and centerline 126F would be coincident. Solely compensating bumps 112 at the alignment temperature may be acceptable when using a coarse pitch array because the bumps would be farther spaced apart and could themselves be larger. But compensating and offsetting (a.k.a., adjusting) of bumps 112 at the alignment temperature allows for use of a fine pitch array with smaller bumps that can be properly connected due to the increased accuracy of the positioning of the array of bumps 112 with respect to the array posts 118 at the bonding temperature. In addition, the amount of strain on each solder bump 122 after the assembled substrate 102 and die 104 cool to room temperature (after bonding thereof) can be minimized.

Figure 3:
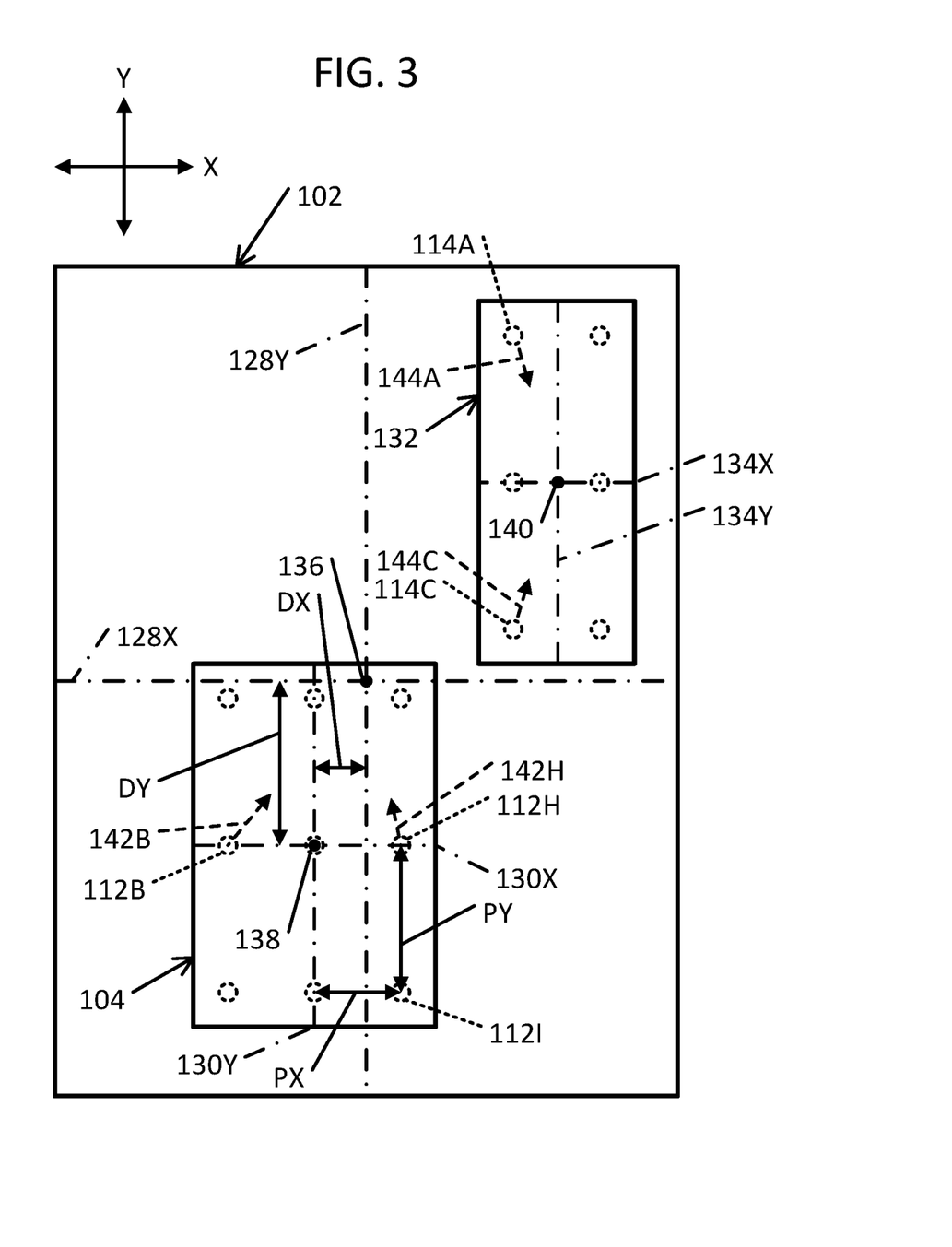
FIG. 3 is a top view of a substrate assembled with two dies, according to embodiments of the present disclosure.

FIG. 3 is a top view of substrate 102 assembled with die 104 and die 132. In the illustrated embodiment, die 104 is bonded to substrate 102 at site 108 (shown in FIG. 1), and die 132 is bonded to substrate 102 at site 110 (shown in FIG. 1). Bumps 112 and 114 are shown in phantom for the purpose of discussing the adjustment of their positions (although not all of them include reference numerals), and substrate centerlines 128X, 128Y, die centerlines 130X, 130Y, and die centerlines 134X, 134Y are also depicted. Substrate centerlines 128X, 128Y converge at substrate center 136, die centerlines 130X, 130Y converge at die center 138, and die centerlines 134X, 134Y converge at die center 140.

As discussed previously, the positions of bumps 112 can be adjusted during the design of substrate 102 to account for the thermal expansion between the alignment temperature and the bonding temperature, including the asymmetric positioning of die 104 on substrate 102. While this was depicted in one dimension in FIG. 2B, the same theory can be applied in two dimensions, as shown in FIG. 3. To obtain the position of each bump 112 at alignment temperature, each bump 112 is initially placed as to match the positions of posts 118 (shown in FIG. 2B) at the alignment temperature. From these initial positions, the adjustment of each bump 112 can be performed according the Equations 1-6 shown below:

$$comp\_x = PX*[CTE\_sub*(T\_sub\_bo - T\_sub\_al) - CTE\_die*(T\_die\_bo - T\_die\_al)]; \quad \text{Eq. 1:}$$

$$off\_x = DX*[CTE\_sub*(T\_sub\_bo - T\_sub\_al)]; \quad \text{Eq. 2:}$$

$$adjust\_x = comp\_x + off\_x; \quad \text{Eq. 3:}$$

and $$comp\_y = PY*[CTE\_sub*(T\_sub\_bo - T\_sub\_al) - CTE\_die*(T\_die\_bo - T\_die\_al)]; \quad \text{Eq. 4:}$$

$$off\_y = DY*[CTE\_sub*(T\_sub\_bo - T\_sub\_al)]; \quad \text{Eq. 5:}$$

$$adjust\_y = comp\_y + off\_y; \quad \text{Eq. 6:}$$

wherein the components in the equations have the following meanings (in alphabetical order):

adjust_x is the total adjustment of a bump's position due to thermal expansion in the X-direction;

adjust_y is the total adjustment of a bump's position due to thermal expansion in the Y-direction;

comp_x is the amount of compensation of a bump's position in the X-direction;

comp_y is the amount of compensation of a bump's position in the Y-direction;

CTE_sub is the coefficient of thermal expansion of substrate 102;

CTE_die is the coefficient of thermal expansion of die 104;

DX is the distance from die center 138 to substrate center 136 in the X-direction;

DY is the distance from die center 138 to substrate center 136 in the X-direction;

off_x is the amount of offset of a bump's position in the X-direction;

off_y is the amount of offset of a bump's position in the Y-direction;

PX is the distance from the bump 112 being adjusted to die center 128 in the X-direction;

PY is the distance from the bump 112 being adjusted to die center 128 in the Y-direction;

T_sub_bo is the bonding temperature of substrate 102;

T_sub_al is the alignment temperature of substrate 102;

T_die_bo is the bonding temperature of die 104;

T_die_al is the alignment temperature of die 104.

As shown by Equations 1-6, the compensation of each bump 112 depends on its position with respect to die center 138. However, the offset of each bump 112 depends on the position of die 104 with respect to substrate 102. More specifically, the offset depends on the position of die center 138 with respect to substrate center 136 and is the same for each bump 112 in site 108 (shown in FIG. 1). Once both total adjustments in the X and Y directions have been respectively computed for each bump 112, the resultant adjustment vectors can be added to the initial positions to obtain the adjusted positions of each bump 112. Two exemplary adjustment vectors 142B, 142H are shown in FIG. 3 for bumps 112B, 112H, respectively, which both point to substrate center 136. Thereby, the positions of bumps 112 are thermally compensated with respect to substrate center 136 and is asymmetric with respect to die 104.

In contrast, substrate 102 can include site 110 (shown in FIG. 1) that lacks the offsetting of bumps 114. To calculate the positions of each bump 114 from its initial position, only Equations 1 and 4 can be used. The resultant adjustment vectors point to die center 140, as shown by two exemplary adjustment vectors 144A, 144C for bumps 114A, 114C, respectively. Thereby, the positions of bumps 114 are thermally compensated with respect to die center 140 and is symmetric with respect to die 132. As stated previously, such compensation without offsetting can be useful, for example, if die bumps (not shown) and bumps 114 have a coarse pitch.

Figure 4:
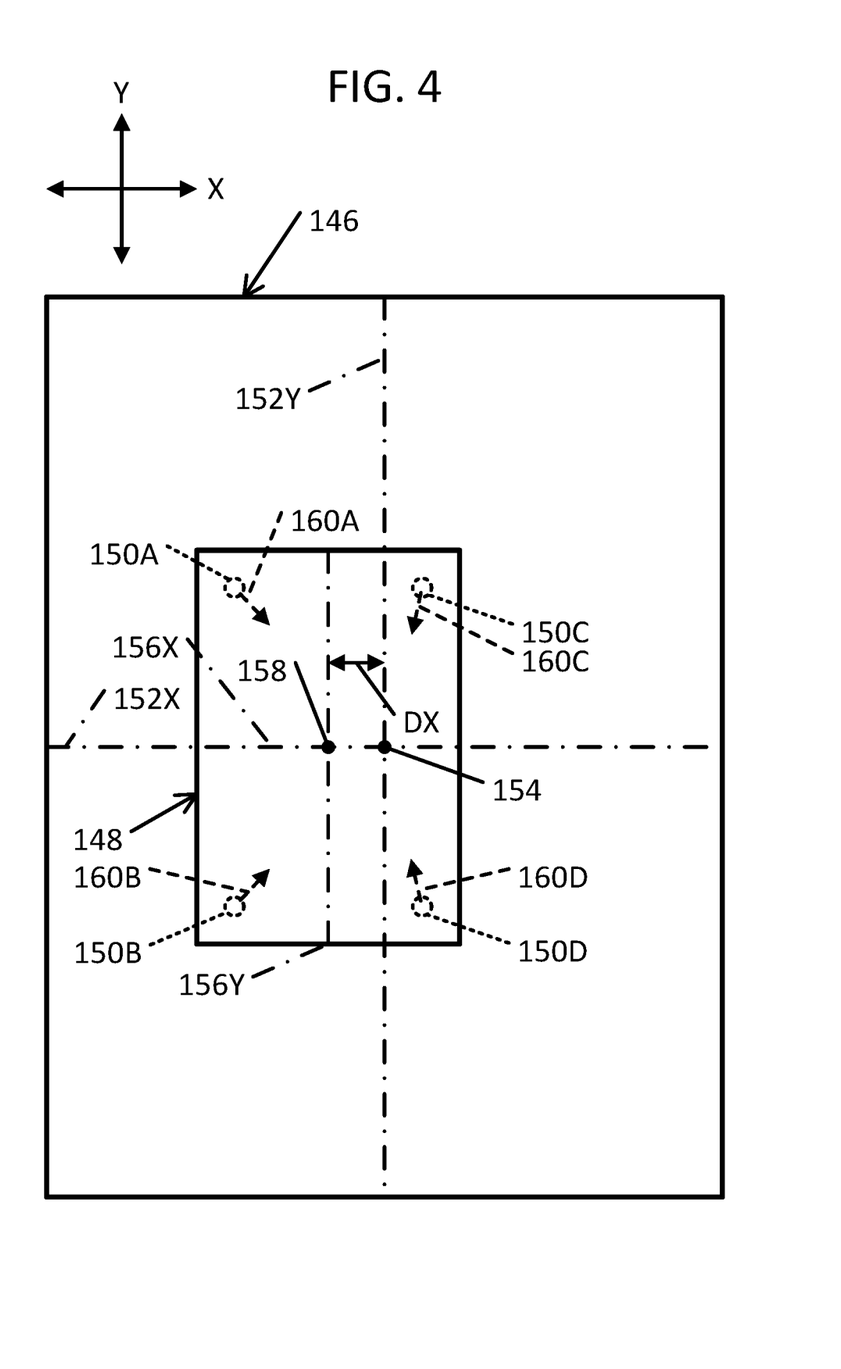
FIG. 4 is a top view of an example substrate assembled with one die, according to embodiments of the present disclosure.

FIG. 4 is a top view of an example substrate 146 assembled with die 148. Substrate 146 includes bumps 150A-150D (collectively, "bumps 150") (shown in phantom). Substrate 146 also includes substrate centerlines 152, 152Y, which converge at substrate center 154, and die 148 includes die centerlines 156X, 156Y, which converge at die center 158.

In the illustrated embodiment, die center 158 is spaced apart from substrate center 154 only in the X-direction. For this example, the variables in Equations 1-6 above are as follows:

CTE_sub=14.6 ppm/° C.;
CTE_die=3.2 ppm/° C.;
DX=3.55 mm;
DY=0 mm;
PX=±5.945 mm (depending on the bump 150);
PY=±14.525 (depending on the bump 150);
T_sub_bo=100° C.;
T_sub_al=25° C.;
T_die_bo=240° C.;
T_die_al=25° C.

Working through Equations 1 and 4 yields compensations in the X and Y directions for bump 150A being +2.42 µm and −5.91 µm, for bump 150B being +2.42 µm and +5.91 µm, for bump 150C being −2.42 µm and −5.91 µm, and for bump 150D being −2.42 µm and +5.91 µm, respectively. Working through Equations 2 and 5 yields offsets in the X and Y directions for each of bumps 150 being +3.88 μm and 0.00 μm, respectively (since die center 158 is not spaced apart from substrate center 154 in the Y-direction). Working through Equations 3 and 6 yields adjustments in the X and Y directions for bump 150A being +6.30 μm and −5.91 μm, for bump 150B being +6.30 μm and +5.91 μm, for bump 150C being 1.46 μm and −5.91 μm, and for bump 150D being −1.46 μm and +5.91 μm, respectively.

Figure 5:
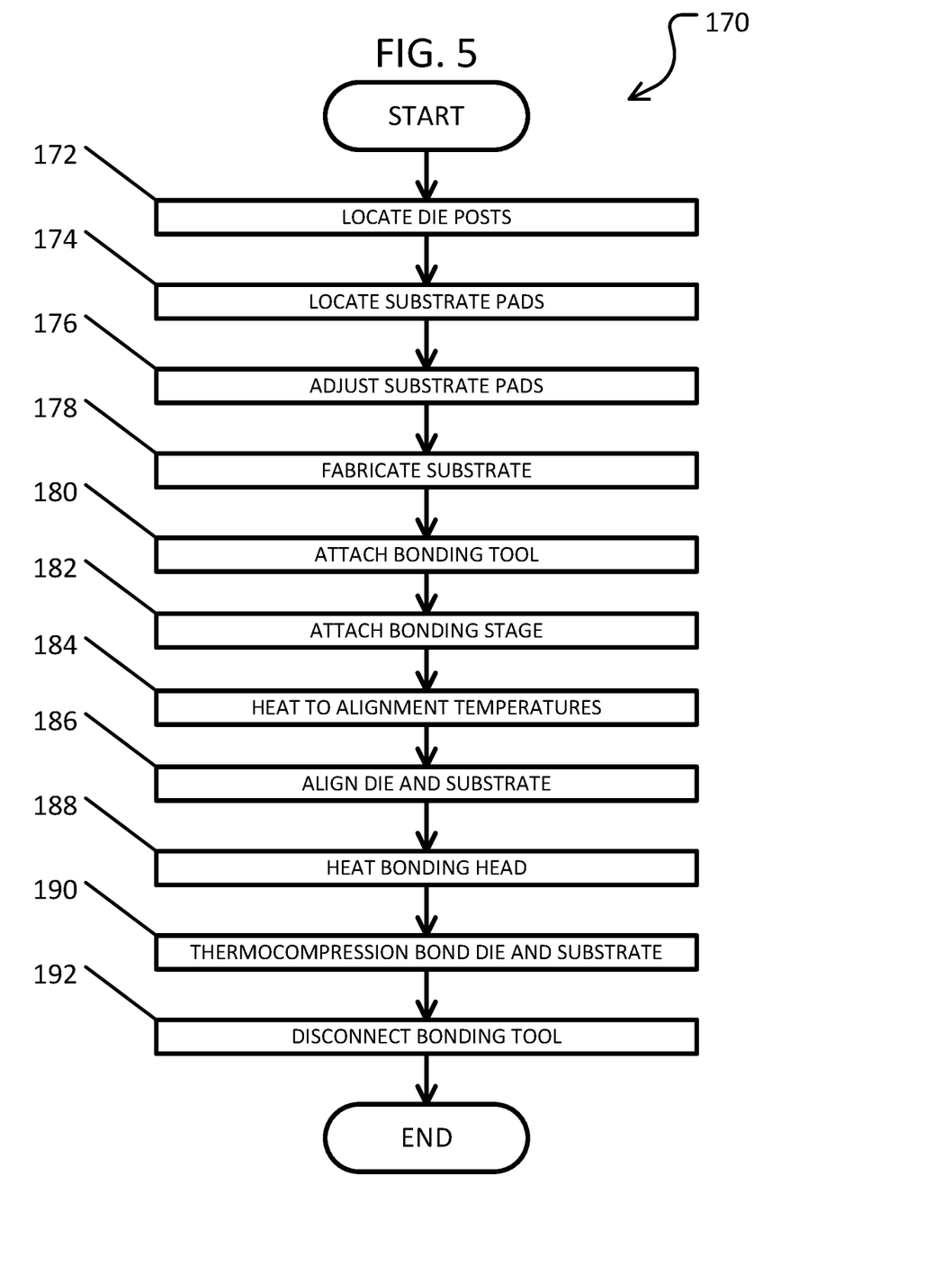
FIG. 5 is a flowchart of a method of making an ICPS system, according to embodiments of the present disclosure.

FIG. 5 is a flowchart of method 170 of making ICPS system 100. During the discussion of method 170, features and reference numerals from FIGS. 1-4 may be used. In the illustrated embodiment, at block 172, each post 118 is located on die 104 at the die bonding temperature. Block 172 can be performed, for example, by measuring a die 104 at the die bonding temperature, or by calculating the thermal expansion of die 104 based on specifications from the manufacturer of die 104. At block 174, locations for each bump 112 at the substrate bonding temperature are established to correspond to the locations of each post 118 at the die bonding temperature. At block 176, locations for each bump 112 are adjusted for thermal expansion with respect to substrate center 136 at the substrate alignment temperature. At block 178, substrate 102 is fabricated with bumps 112 being positioned at their respective adjusted locations.

At block 180, die 104 is attached to bonding head 106, for example, by bonding head 106 picking die 104 up using vacuum pressure. At block 182, substrate 102 is attached to bonding stage 103, for example, using vacuum pressure. At block 184, die 104 is heated to a die alignment temperature, and substrate 102 is heated to a substrate alignment temperature. At block 186, die 104 is aligned with substrate 102 at the alignment temperature. At block 188, bonding head 106 can be heated to a head bonding temperature, which heats substrate 102 to a substrate bonding temperature. At block 190, die 104 is forcefully held in contact with substrate 102 while die 104 is heated to a die bonding temperature, which bonds die 104 to substrate 102 by thermocompression bonding. At block 192, bonding head 106 is separated from die 104.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit package substrate (ICPS) system comprising:
   a first die including a first array of connectors; and
   a substrate including a second array of connectors that is configured to be thermocompression bonded to the first array of connectors at a bonding temperature that is above a solder melting temperature;
   wherein the first die is bonded to the substrate such that the first die is asymmetric with respect to a substrate center; and
   wherein the second array of connectors is adjusted, at an alignment temperature that is below the solder melting temperature, for thermal expansion to the bonding temperature with respect to a reference point that is not a first die center.

2. The ICPS system of claim 1, wherein the reference point is the substrate center.

3. The ICPS system of claim 1, wherein the first die center is spaced apart from the substrate center when the first die is bonded to the substrate.

4. The ICPS system of claim 1, wherein the first array of connectors and the second array of connectors are aligned at the bonding temperature.

5. The ICPS system of claim 1, wherein the first die has a first coefficient of thermal expansion and the substrate has a second coefficient of thermal expansion that is at least 2 ppm/° C. higher than the first coefficient of thermal expansion.

6. The ICPS system of claim 1, further comprising:
   a second die including a third array of connectors;
   wherein the substrate further comprises a fourth array of connectors that is adjusted, at the alignment temperature, for thermal expansion to the bonding temperature.

7. The ICPS system of claim 6, wherein the fourth array of connectors is adjusted with respect to a substrate center.

8. The ICPS system of claim 6, wherein the fourth array of connectors is adjusted with respect to a second die center.

9. The ICPS system of claim 1, wherein the die is no greater than 800 mm$^2$.

10. The ICPS system of claim 1, wherein the first array of connectors comprises a plurality of electrical conductors wherein a first portion of the plurality of electrical conductors has a first pitch of no more than 100 μm.

11. The ICPS system of claim 10, wherein a second portion of the plurality of electrical conductors has a second pitch that is different from the first pitch.

12. The ICPS system of claim 1, wherein the first array of connectors comprises a plurality of electrical conductors with a height of no more than 50 μm and a width of no more than 50 μm.

13. The ICPS system of claim 12, wherein each of the plurality of electrical conductors includes a solder bump with a height of at least 3 μm.

14. The ICPS system of claim 1, further comprising:
   a bonding head attached to the die opposite of the substrate;
   wherein the bonding is configured to compress the die against the substrate during bonding of the die to the substrate; and
   wherein the bonding head is configured to be separated from the die after the die is bonded to the substrate.

15. A method of making an integrated circuit package substrate (ICPS) system, the method comprising:
   locating each connector in a first array of connectors on a die at a bonding temperature that is above a solder melting temperature;
   adjusting locations for each connector in a second array of connectors on a substrate at an alignment temperature with respect to a reference point that is not a die center such that the second array of connectors is aligned with the first array of connectors when the first array of connectors and the second array of connectors are at the bonding temperature that is above the solder melting temperature;
   aligning the die and the substrate at the alignment temperature that is below the solder melting temperature such that the die is asymmetric with respect to a substrate center;
   heating the first array of connectors to the bonding temperature;

heating the second array of connectors to the bonding temperature; and thermocompression bonding the die to the substrate.

16. The method of claim 15, wherein the reference point is the substrate center.

17. The method of claim 15, further comprising:

attaching the die to a bonding head prior to aligning the die and the substrate; and separating the die from the bonding head subsequent to bonding the die to the substrate.

18. The method of claim 15, wherein the die has a first coefficient of thermal expansion and the substrate has a second coefficient of thermal expansion that is at least 2 ppm/° C. higher than the first coefficient of thermal expansion.

19. An integrated circuit package substrate (ICPS) system comprising:

a substrate having a first coefficient of thermal expansion, the substrate comprising a first array of connectors; and a first die having a second coefficient of thermal expansion that is different than the first coefficient of thermal expansion, the first die comprising a second array of connectors;

wherein the first die is thermocompression bonded to the substrate by connecting the first array of connectors and the second array of connectors;

wherein the first die is positioned asymmetrically with respect to a substrate center; and wherein the first array of connectors is thermally adjusted asymmetrically with respect to a first die center in both a first direction and a second direction that is orthogonal to the first direction.

20. The ICPS system of claim 19, further comprising:

a second die comprising a third array of connectors; and a fourth array of connectors on the substrate that is thermally adjusted symmetrically with respect to a second die center in both the first direction and the second direction.

* * * * *